United States Patent
Frazier

(10) Patent No.: US 6,906,650 B2
(45) Date of Patent: Jun. 14, 2005

(54) METHOD AND APPARATUS FOR GENERATING A PULSE OF VERY NARROW WIDTH

(75) Inventor: Gary A. Frazier, Garland, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/716,698

(22) Filed: Nov. 19, 2003

(65) Prior Publication Data

US 2005/0104757 A1 May 19, 2005

(51) Int. Cl.$^7$ ................................................. H03M 1/00
(52) U.S. Cl. ..................................... 341/133; 341/155
(58) Field of Search ............................... 341/155, 133, 341/159, 118, 120, 143, 156, 163, 161; 257/144, 76, 99, 101, 103; 359/326–332; 372/6, 21, 22, 92; 358/15

(56) References Cited

U.S. PATENT DOCUMENTS

| | | | | |
|---|---|---|---|---|
| 5,889,487 A | * | 3/1999 | Burns et al. | 341/159 |
| 6,344,659 B1 | * | 2/2002 | Ivanov et al. | 257/30 |
| 6,348,887 B1 | | 2/2002 | Broekaert | |
| 6,373,423 B1 | * | 4/2002 | Knudsen | 341/159 |
| 6,509,859 B1 | | 1/2003 | van der Wagt | |
| 6,573,530 B1 | * | 6/2003 | Sargent et al. | 257/25 |

OTHER PUBLICATIONS

Richard H. Mathews, et al., "A New RTD–FET Logic Family", Proceedings of the IEEE, vol. 87, No. 4, Apr. 1999, pp. 596–605.

Product Data Sheet, "Sampling Phase Detector", Metelics Corporation, Sunnyvale, California, 6 unnumbered pages, 2000.

Product Data Sheet, "Sampling Phase Detectors" Alpha Industries, Inc., Woburn, Massachusetts, 3 pages, 2000.

"Sketch A (Prior Art)", 1 sheet, author and source unknown, no date.

* cited by examiner

*Primary Examiner*—Brian Young
(74) *Attorney, Agent, or Firm*—Baker Botts L.L.P.

(57) ABSTRACT

A circuit includes a resonant tunneling device which is responsive to an input signal for causing an electrical signal characteristic to undergo a quantum jump in magnitude that takes an interval of time. According to one feature, a differentiator responds to the quantum jump in magnitude by producing a narrow pulse with a duration which is approximately the interval of time. According to a different feature, a sampling portion responds to the quantum jump in magnitude by sampling a signal during a time period having a duration which is approximately the interval of time.

24 Claims, 5 Drawing Sheets

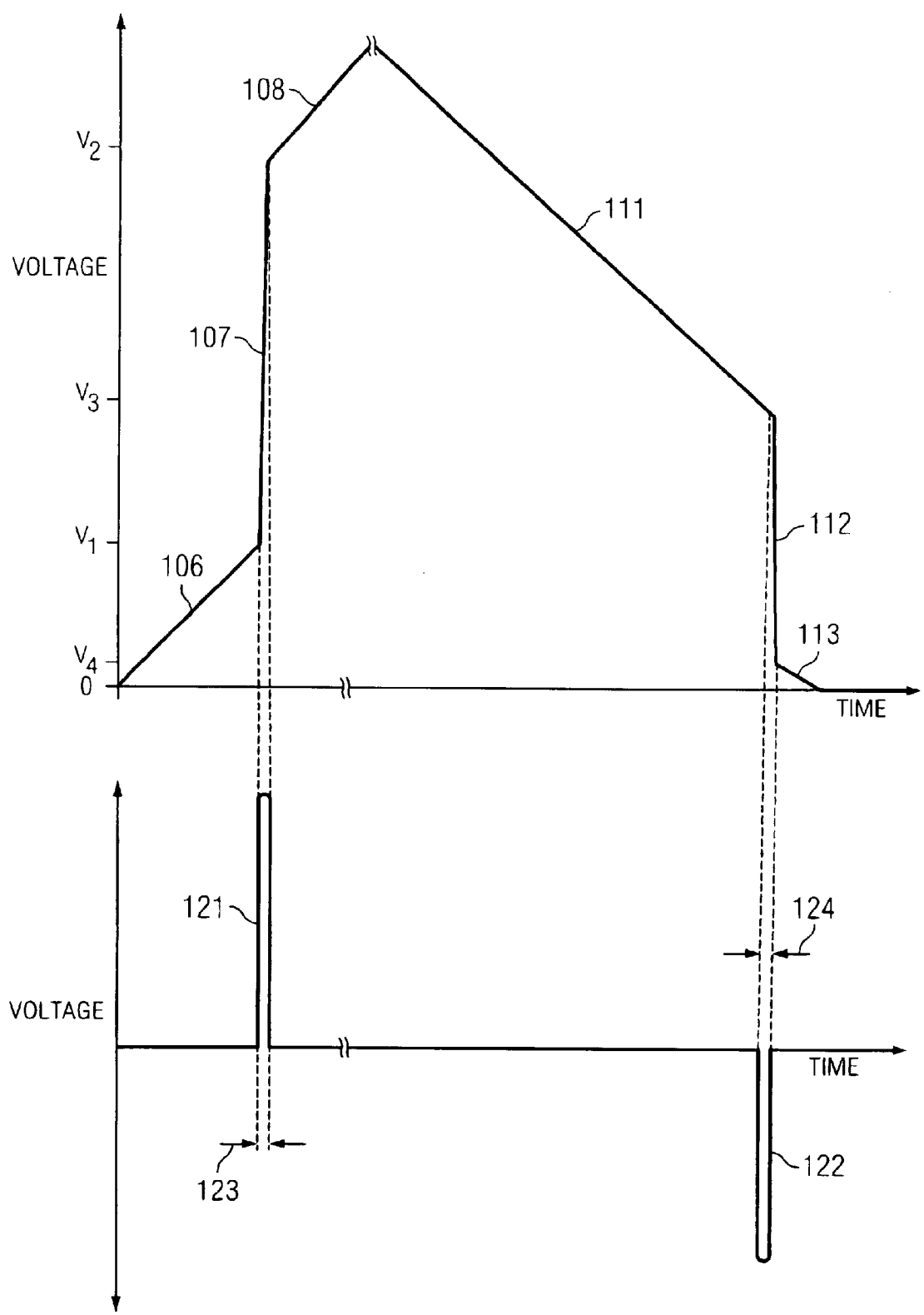

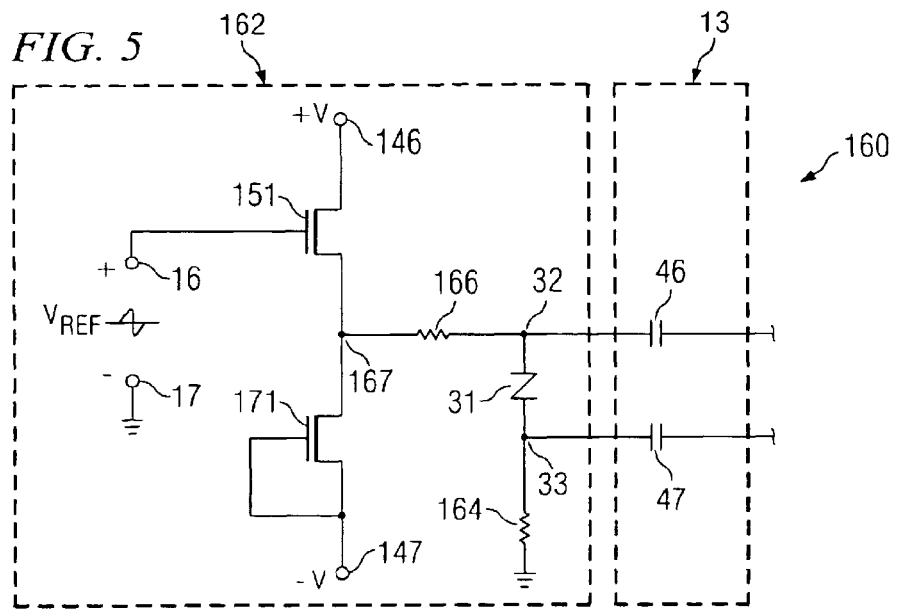
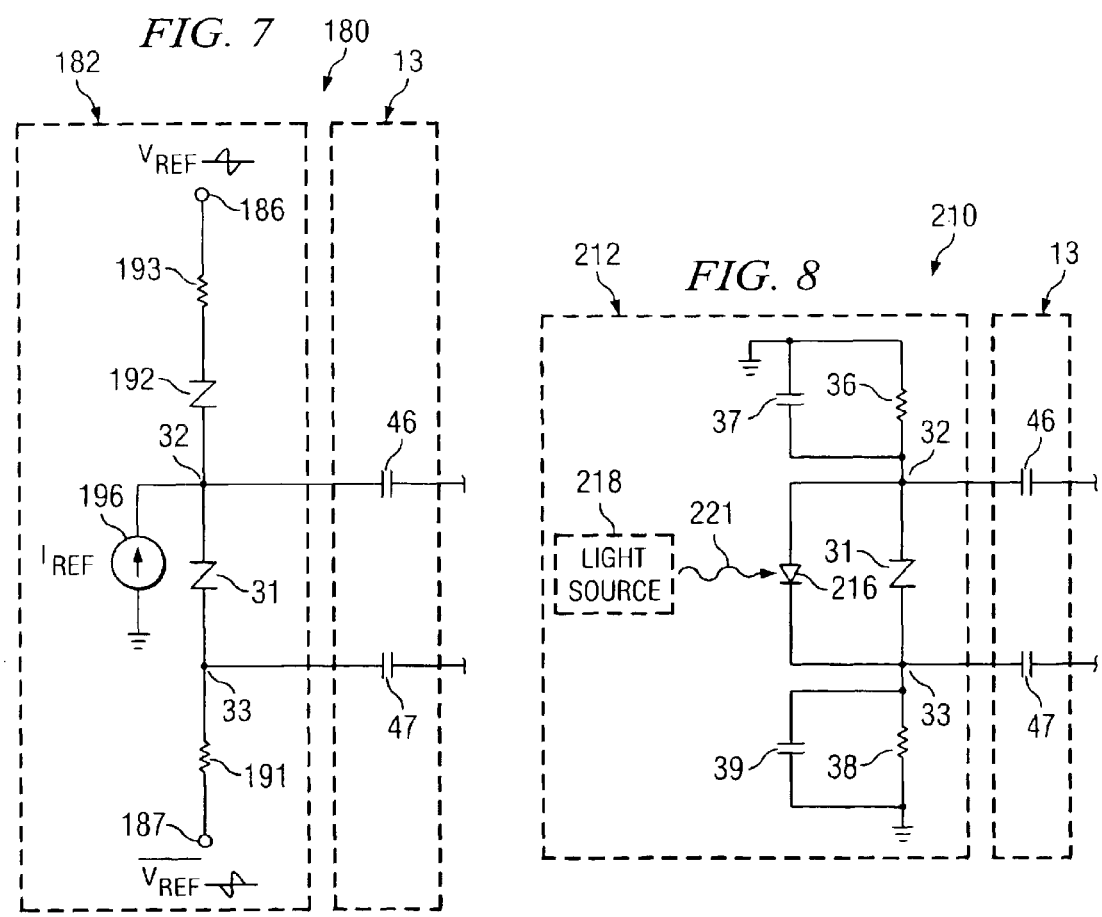

METHOD AND APPARATUS FOR GENERATING A PULSE OF VERY NARROW WIDTH

TECHNICAL FIELD OF THE INVENTION

This invention relates in general to high-frequency circuits and, more particularly, to high-frequency circuits which utilize a pulse with a very narrow width.

BACKGROUND OF THE INVENTION

In high-frequency circuits, there is often a need for a pulse having a very narrow width. As one example, there are low-noise, phase-locked microwave oscillators which effect phase sampling with a solid-state phase detector. In a known system, the sampling phase detector uses a step recovery diode (SRD) to generate a pulse which has a fairly narrow width, and which is used to clock a diode bridge mixer-phase detector. In particular, the voltage across the SRD is differentiated, in order to generate a pulse that corresponds to a time interval when the SRD voltage has a fairly high slew rate. Although circuits of this type have been generally adequate for their intended purposes, they have not been satisfactory in all respects.

More specifically, the narrow pulses generated by differentiating an SRD voltage have a width of approximately 22 to 50 picoseconds. While this is sufficiently narrow for many systems, there are other systems which operate at very high frequencies, where even this narrow pulse width is too large, and can produce undesirable effects such as jitter, and/or limits on the gain-bandwidth product.

SUMMARY OF THE INVENTION

From the foregoing, it may be appreciated that a need has arisen for a method and apparatus which avoid at least some of the disadvantages of pre-existing techniques. According to one form of the invention, a method and apparatus are provided to address this need, and involve: providing a circuit having a first portion which includes a resonant tunneling device, and a second portion which includes a differentiator; applying to the first portion an input signal; causing the resonant tunneling device to respond to the input signal by effecting a quantum jump in magnitude of an electrical signal characteristic from a first value to a second value, the second value being substantially different from the first value, and the quantum jump in magnitude from the first value to the second value taking an interval of time; and causing the differentiator to respond to the quantum jump of the electrical signal characteristic from the first value to the second value by producing a narrow pulse having a duration which is approximately equal to the interval of time.

A different form of the invention involves: providing a circuit having a first portion which includes a resonant tunneling device, and a second portion which includes a sampling portion with a sampling input; applying to the first portion an input signal; applying to the sampling input a signal to be sampled; causing the resonant tunneling device to respond to the input signal by effecting a quantum jump in magnitude of an electrical signal characteristic from a first value to a second value, the second value being substantially different from the first value, and the quantum jump in magnitude from the first value to the second value taking an interval of time; and causing the sampling portion to respond to the quantum jump in magnitude of the electrical signal characteristic from the first value to the second value by sampling the signal at the sampling input during a time period which is approximately equal in duration to the interval of time.

BRIEF DESCRIPTION OF THE DRAWINGS

A better understanding of the present invention will be realized from the detailed description which follows, taken in conjunction with the accompanying drawings, in which:

FIG. 3 depicts two related graphs, the upper graph showing how the voltage across the resonant tunneling diode will vary over time as the current through it is progressively increased and then progressively decreased, and the lower graph showing an output voltage that a differentiating portion of the circuit of FIG. 1 will produce over time in response to the voltage shown in the upper graph;

FIG. 5 is a schematic circuit diagram of an apparatus which is another alternative embodiment of the apparatus of FIG. 1, and which embodies aspects of the present invention;

FIG. 7 is a schematic circuit diagram of an apparatus which is still another alternative embodiment of the apparatus of FIG. 1, and which embodies aspects of the present invention; and FIG. 8 is a schematic circuit diagram of an apparatus which is yet another alternative embodiment of the apparatus of FIG. 1, and which embodies aspects of the present invention.

DETAILED DESCRIPTION

Figure 1:
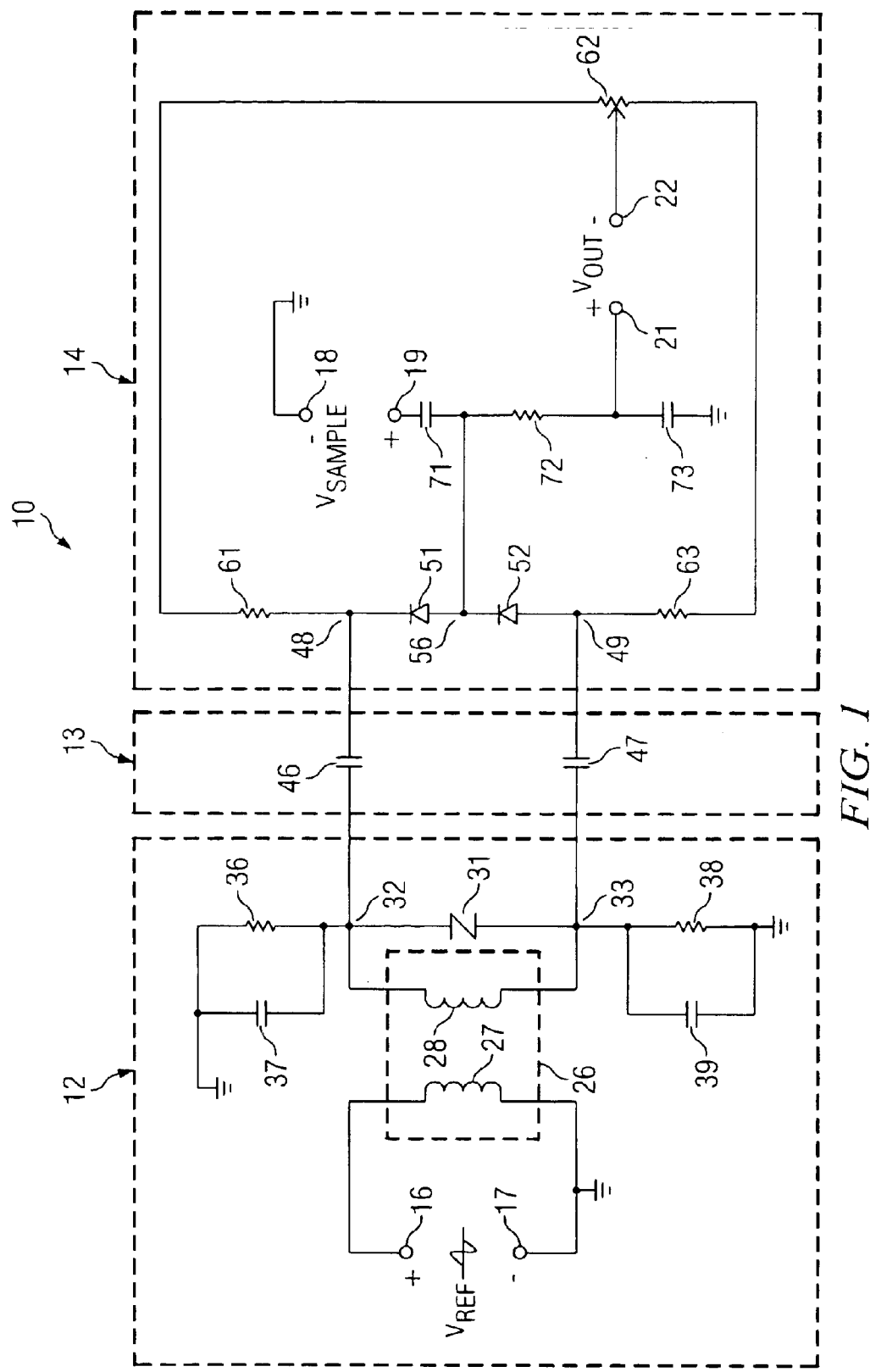
FIG. 1 is a schematic circuit diagram of an apparatus which is a sampling phase detector circuit that embodies aspects of the present invention.

FIG. 1 is a schematic diagram of an apparatus which is a sampling phase detector circuit 10. The circuit 10 includes an input portion 12, a differentiating portion 13, and a sampling portion 14. The circuit 10 has a reference input defined by a pair of terminals 16 and 17 in the input portion 12, a sample input defined by a pair of terminals 18 and 19 in the sampling portion 14, and an output defined by a pair of terminals 21 and 22 in the sampling portion 14.

The input portion 12 includes a transformer 26 with an input coil 27 and an output coil 28. The ends of the input coil 27 are each coupled to a respective one of the input terminals 16 and 17, and the input terminal 17 is also coupled to ground. The input portion 12 includes a resonant tunneling diode (RTD) 31 of a known type, which is coupled between two nodes 32 and 33 of the circuit. The ends of the output coil 28 of the transformer 26 are each coupled to a respective one of the two nodes 32 and 33. The input portion 12 also includes a resistor 36 and a capacitor 37, which are coupled in parallel between the node 32 and ground, and a resistor 38 and a capacitor 39, which are coupled in parallel between the node 33 and ground. The resistors 36 and 38 are substantially equivalent, and the capacitors 37 and 39 are substantially equivalent.

The differentiating portion 13 has two capacitors 46 and 47, which are substantially equivalent, and which effectively serve as a differentiator. The capacitor 46 has one end coupled to the node 32, and its opposite end coupled to a node 48. The capacitor 47 has one end coupled to the node 33, and its opposite end coupled to a node 49.

The sampling portion 14 includes two Schottky diodes 51 and 52, which are equivalent. The diodes 51 and 52 are coupled in series between the nodes 48 and 49, and a further node 56 is defined between the diodes 51 and 52. The diodes 51 and 52 are oriented so that the cathode of diode 51 is coupled to the node 48, and the anode of diode 52 is coupled to the node 49. The sampling portion 14 has three resistors 61–63 which are coupled in series with each other between the nodes 48 and 49. The resistors 61 and 63 have substantially the same resistance. The resistor 62 is a variable trim resistor, with a slider coupled to the terminal 22 of the output. The resistor 62 can be adjusted so as to maintain balance within the illustrated circuit.

In the sampling portion 14, the terminal 18 of the sample input is coupled to ground. A capacitor 71 is coupled between the node 56 and the terminal 19 of the sample input. A resistor 72 is coupled between the node 56 and the terminal 21 of the output, and a capacitor 73 is coupled between the terminal 21 and ground.

The RTD 31 is a device of a known type, with operational characteristics which are known in the art. Nevertheless, to facilitate an understanding of the present invention, the operational characteristics of the RTD 31 are discussed briefly here.

Figure 2:
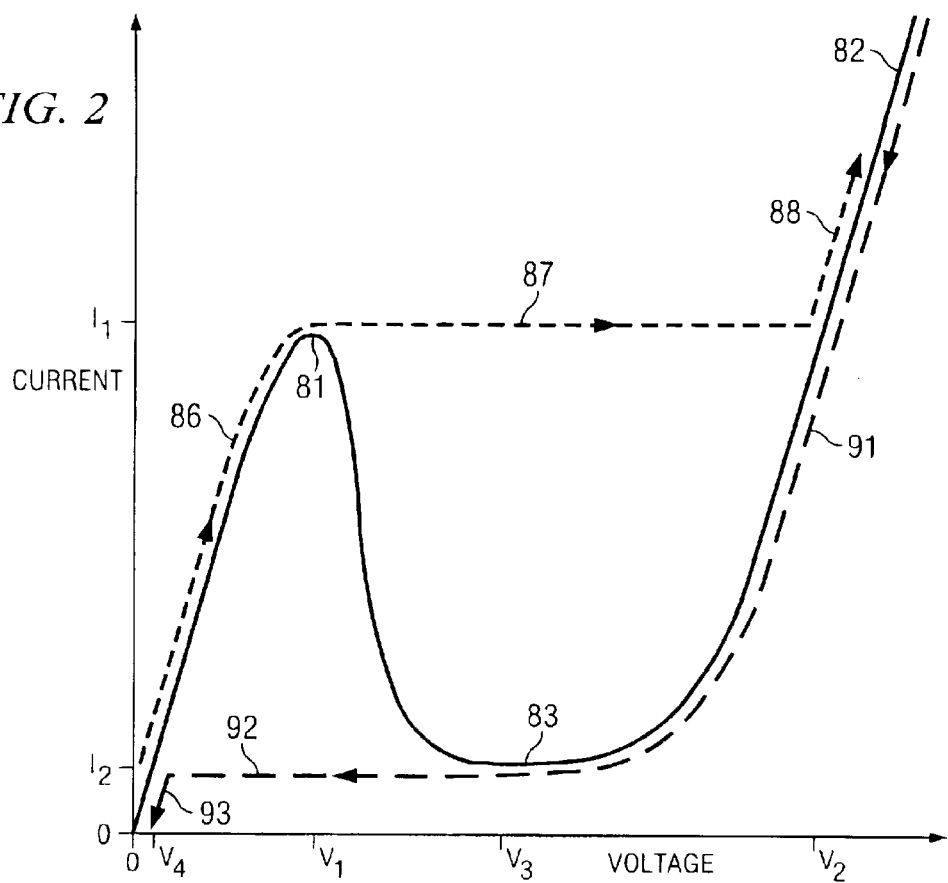
FIG. 2 is a graph of a curve that shows how a current flowing through a resonant tunneling diode in the embodiment of FIG. 1 will vary in response to variation of a voltage applied across it.

FIG. 2 is a graph of a curve that shows how a current flowing through the RTD 31 will vary in response to variation of a voltage applied across the RTD 31. It will be noted that the current has a resonant peak at 81, and has a further and larger resonant peak at 82, which is not visible in its entirety in FIG. 2. There is a valley 83 between the two peaks 81 and 82.

Although the curve in FIG. 2 can be viewed as a representation of how current varies as a function of a variation in voltage, it can conversely be viewed as a representation of how voltage varies as a function of a variation in current. In this regard, it will be noted that, as the current through the RTD is progressively increased to a value of $I_1$, from a value of zero, the voltage progressively increases to a value of $V_1$ from a value of zero, as indicated diagrammatically at 86.

Then, as soon as the current exceeds $I_1$ the voltage suddenly makes a quantum jump at 87 from a value of $V_1$ at the top of the resonant peak 81 to a value of $V_2$ at a point along the leading edge of the resonant peak 82. As is known in the art, this significant change in voltage from $V_1$ to $V_2$ occurs extremely rapidly, for example as fast as 1.5 to 2.0 picoseconds. Then, as the current continues to progressively increase above $I_1$, the voltage progressively increases above $V_2$, as indicated diagrammatically at 88.

Assume that the current is thereafter progressively decreased. The voltage also progressively decreases, as indicated diagrammatically at 91. The decreasing current eventually reaches a value of $I_2$, which corresponds to a voltage $V_3$. As soon as the current is decreased below the value $I_2$, then the voltage very rapidly makes a quantum jump at 92 from the voltage $V_3$ to the voltage $V_4$, and then continues to progressively decrease, as indicated at 93. The change at 92 from the voltage $V_3$ to the voltage $V_4$ occurs very rapidly, for example in about 1.5 to 2.0 picoseconds. The time intervals of 1.5 to 2.0 picoseconds mentioned above are typical time intervals, but both are determined by the structural configuration of the RTD, and either or both can be varied by adjusting the structural configuration of the RTD.

The curve shown in FIG. 2 represents a relationship between a positive current and a positive voltage for the RTD 31. For a negative current and negative voltage, and as is known in the art, there is a similar curve for the RTD 31, which is a mirror image of the curve shown in FIG. 2, reflected about the origin point at the intersection of the two axes.

During normal operation, a reference voltage $V_{REF}$ is applied between the input terminals 16 and 17. For purposes of the present discussion, this input signal is assumed to be a sine wave, but it could alternatively be some other type of waveform. The transformer 26 responds to this input signal by causing a current to flow through the RTD 31, where the variation in current flow through the RTD conforms to a sine function.

FIG. 3 shows two related graphs. The upper graph shows an example of how the voltage across the RTD 31 varies over time, as the current through the RTD 31 is first progressively increased, and then progressively decreased. In this regard, the curve shown in FIG. 3 has segments 106–108 and 111–113, which respectively correspond to 86–88 and 91–93 in FIG. 2. For clarity in the present discussion, the curve segments 106, 108, 111 and 113 are assumed to correspond to portions of the sine wave where the rate of change is relatively constant, and they are therefore shown in FIG. 3 as straight lines.

The curve segment 107 represents the rapid quantum jump in voltage from $V_1$ to $V_2$, and the curve segment 112 represents the rapid quantum drop in voltage from $V_3$ to $V_4$. As discussed above, it is an inherent characteristic of the RTD 31 that the voltage changes at 107 and 112 each occur very rapidly, for example in about 1.5 to 2.0 picoseconds. The voltage across the RTD 31, such as that shown in the upper graph in FIG. 3, serves as the input to the differentiating portion 13 in the circuit of FIG. 1, which includes the capacitors 46 and 47.

The lower graph in FIG. 3 shows the output voltage that the differentiating portion 13 will produce over time between the nodes 48 and 49, in response to the voltage shown in the upper graph in FIG. 3. In effect, the curve shown in the lower graph of FIG. 3 represents the derivative of the curve shown in the upper graph of FIG. 3. It will be noted that the rapid voltage change at 107 in the upper graph produces a large positive pulse 121 of very narrow width, and the voltage change at 112 produces a large negative pulse 122 of very narrow width. In the disclosed embodiment, the widths 123 and 124 of the pulses 121 and 122 are each in the range of approximately 1.5 to 2.0 picoseconds, for example about 1.7 picoseconds. Due to the polarity of the diodes 51 and 52, the diodes recognize one of the pulses 121 and 122 and ignore the other thereof, such that only one of these pulses actually appears at the node 56 which is located between the diodes 51 and 52. A signal which is to be sampled is applied between the terminals 18–19 of the sample input, and is referred to here as $V_{SAMPLE}$. This signal is an alternating current (AC) signal, and is applied to the storage capacitor 73 through the coupling capacitor 71 and the resistor 72. The voltage across the storage capacitor 73 determines the output voltage $V_{OUT}$ at the output terminals 21–22. When the node 56 receives a large and narrow pulse from the differentiating portion 13 through the diodes 51 and 52, the diodes 51 and 52 effectively couple in the load resistors 61–63, so that a portion of the energy introduced at the sample input 18–19 is absorbed in the load resistors 61–63. This deprives the storage capacitor 73 of a portion of the charge that would otherwise end up on the capacitor 73. Consequently, the pulse from the differentiating portion 13 causes the output voltage $V_{OUT}$ to be different than it otherwise would have been, which represents a form of sampling of the sample signal $V_{SAMPLE}$ during the time duration of the narrow pulse received from differentiating portion 13.

Figure 4:
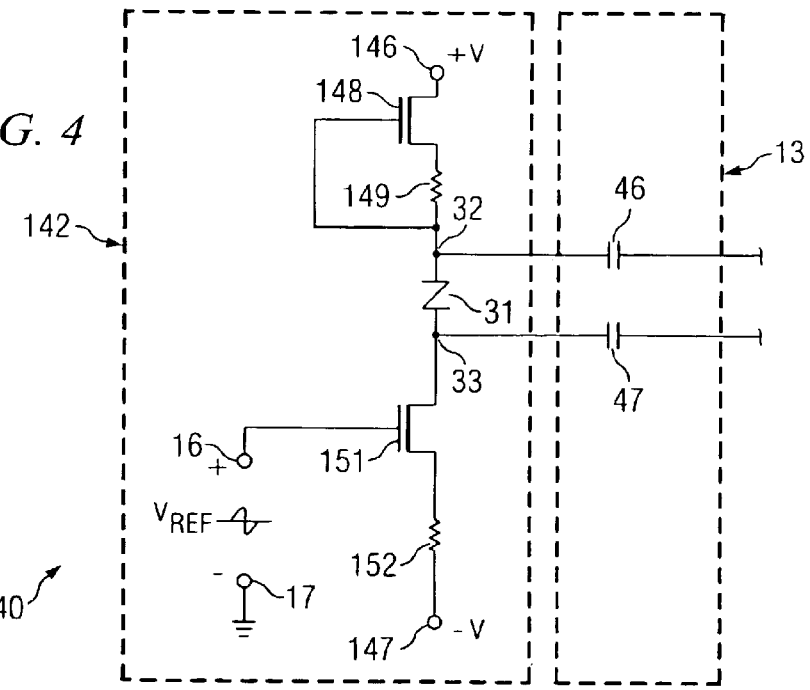
FIG. 4 is a schematic circuit diagram of an apparatus which is an alternative embodiment of the apparatus of FIG. 1, and which embodies aspects of the present invention.

FIG. 4 is a schematic diagram of an apparatus 140, which is an alternative embodiment of the apparatus 10 of FIG. 1. The apparatus 140 includes an input portion 142 which is different from the input portion 12 of FIG. 1, and also includes a differentiating portion 13 and a not-illustrated sampling portion which are respectively identical to the differentiating portion 13 and the sampling portion 14 of FIG. 1. In FIGS. 1 and 4, equivalent parts are identified with the same reference numerals, and the following discussion addresses the differences between these embodiments. The input portion 142 in FIG. 4 includes the input terminals 16 and 17 of the reference input, and also includes the RTD 31. The input portion 142 has two terminals 146 and 147, to which are applied respective direct current (DC) bias voltages +V and −V, which are equal and opposite in magnitude. A field effect transistor (FET) 148 has its source coupled to the terminal 146, and its drain coupled to one end of a resistor 149. The other end of the resistor 149 is coupled to the node 32 between the capacitor 46 and the RTD 31. The gate of the FET 148 is coupled to the node 32.

A further field effect transistor (FET) 151 has its source coupled to the node 33 between the capacitor 47 and RTD 31, and its drain coupled to one end of a resistor 152. The other end of the resistor 152 is coupled to the terminal 147. The gate of the FET is coupled to the terminal 16. In the embodiment of FIG. 4, the FETs 148 and 151 are equivalent, and the resistors 149 and 152 have the same resistance. The FET 148 and resistor 149 effectively serve as a current source, and the FET 151 and the resistor 152 effectively serve as a current sink.

A reference signal is applied to the reference input terminals 16–17, in the form of a voltage which causes dynamic variation in the conductivity of the FET 151, thereby effecting dynamic variation of the amount of current flowing through the FET 148, the resistor 149, the RTD 31, the FET 151, and the resistor 152. Thus, the voltage at the terminals 16–17 is effectively converted into a varying current through the RTD 31, which causes the RTD 31 to produce a voltage between the nodes 32 and 33 which is similar to the voltage shown in the upper graph of FIG. 3. The differentiating portion 13 and not-illustrated sampling portion of the embodiment of FIG. 4 operate the same as their counterparts in the embodiment of FIG. 1, and are therefore not described here in detail.

FIG. 5 is a schematic diagram of an apparatus 160 which is another alternative embodiment of the apparatus 10 of FIG. 1. The apparatus 160 includes an input portion 162 which is different from the input portion 12 of FIG. 1, and also includes a differentiating portion 13 and a not-illustrated sampling portion which are respectively identical to the differentiating portion 13 and the sampling portion 14 of FIG. 1. In FIGS. 1 and 5, equivalent parts are identified with the same reference numerals, and the following discussion addresses the differences between these embodiments.

In the input portion 162 of FIG. 5, the node 33 between the RTD 31 and the capacitor 47 is coupled to one end of a resistor 164, and the other end of the resistor 164 is coupled to ground. A resistor 166 has one end coupled to the node 32 between the capacitor 46 and the RTD 31, and its other end coupled to a node 167. The resistors 164 and 166 have the same resistance. The FET 151 has its source coupled to the terminal 146, its drain coupled to the node 167, and its gate coupled to the terminal 16. The terminal 17 is coupled to ground. A further FET 171 has its source coupled to the node 167, its drain coupled to the terminal 147, and its gate coupled to its own drain. The FET 171 is equivalent to the FET 151. The FET 171 serves as a form of constant current source, which operates substantially independently of changes in the voltage applied across it. Since the current flowing through the FET 171 is constant but the current flowing through the FET 151 is not, variation of the current through the FET 151 operates through the resistor 166 to vary the current flowing through the RTD 131.

As in the input portions of the other embodiments discussed above, the circuitry of the input portion 162 takes the voltage of the reference signal applied at the terminals 16–17 of the reference input, and converts it into a corresponding current flow through the RTD 31. This causes the RTD 31 to generate between the nodes 32 and 33 a voltage comparable to that shown in the upper graph of FIG. 3. The differentiating portion 13 and the not-illustrated sampling portion of the embodiment 160 operate in the same manner as their counterparts in the embodiment of FIG. 1, and their operation is therefore not described here in detail.

Figure 6:
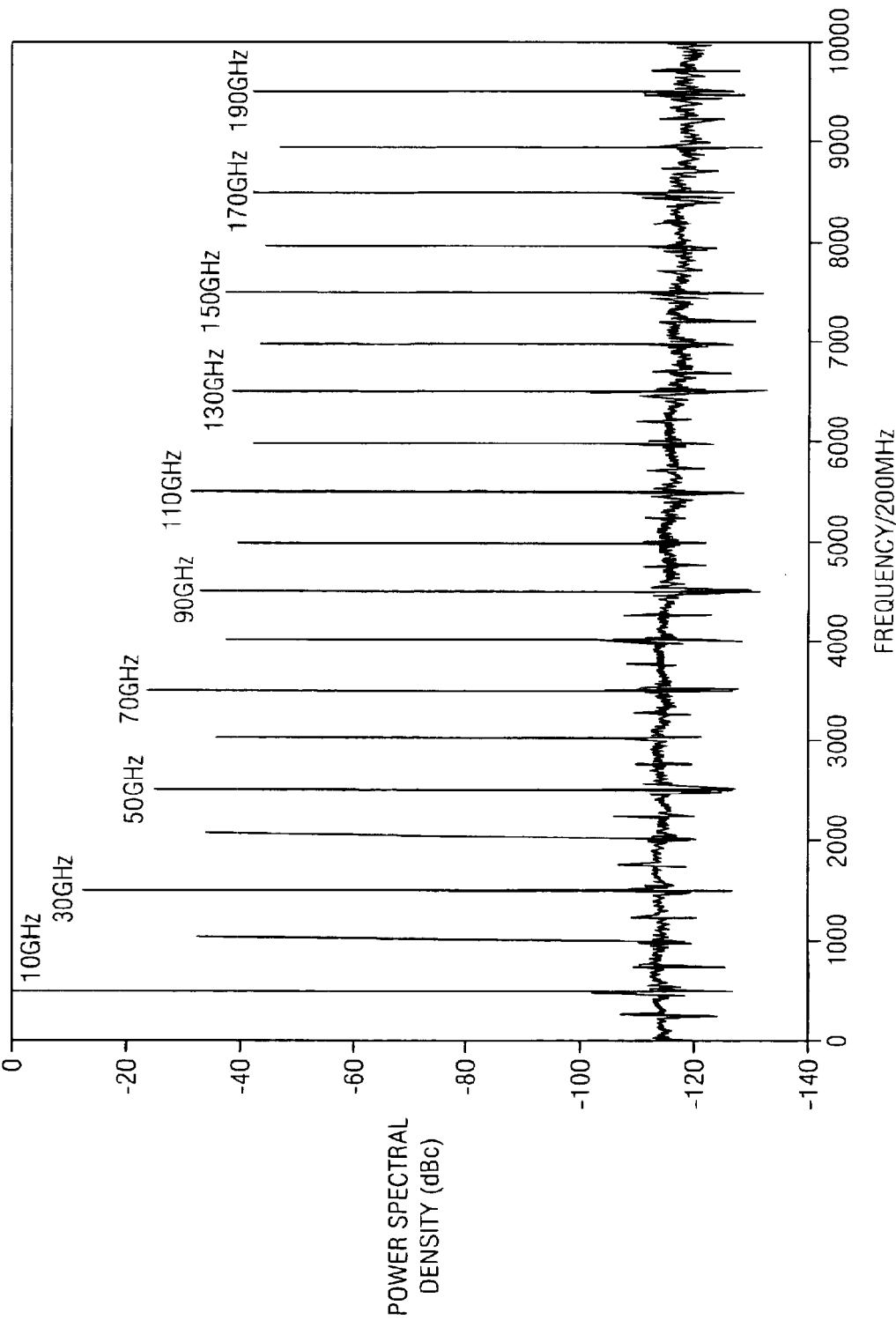
FIG. 6 is a graph which depicts a power spectral density in relation to frequency of an output of a resonant tunneling diode in the embodiment of FIG. 5.

FIG. 6 is a graph which depicts an operational characteristic of the circuit of FIG. 5. In particular, FIG. 6 shows the power spectral density of the output of the RTD 151 (vertical axis), in relation to frequency (horizontal axis). This characteristic is determined mathematically by multiplying the Fourier transform of the voltage across the RTD by its complex conjugate. The units along the X-axis represent frequency/200 MHz. The units along the Y-axis are dBc, or in other words Decibels relative to the power in the input carrier to the circuit. The curve of FIG. 6 corresponds to application of a 10 GHz sine wave to the input of the FET 151. The two FETs 151 abd 171 serve as a non-inverting buffer of this signal, and the buffered output is applied to the resistor 166. The resistor 166 converts this voltage into a current, which is used as a sinusodial bias current to the RTD.

As evident from FIG. 6, the effective output of the RTD is rich in harmonics, up to and above 200 GHz. In particular, these harmonics are seen in the plot as strong, discrete peaks in the power spectral density at various frequencies. Peaks are visible at the fundamental frequency (10 GHz), and at even and odd harmonics up to 190 GHz. Actually, the slow drop in spectral power with increasing frequency shows that the RTD waveform provides a very narrow pulse that will approximate an ideal impulse generator, running at the frequency of the input (which in this example case is 10 GHz). The harmonics are desirable for certain applications, for example where a circuit of the type shown in FIG. 5 is used as part of a low noise, phaselocked microwave oscillator. The harmonics permit phase lock to be accurately and reliably achieved at frequencies which are multiples of the fundamental frequency.

FIG. 7 is a schematic diagram of an apparatus 180, which is still another alternative embodiment of the apparatus 10 of FIG. 1. The apparatus 180 includes an input portion 182, which is different from the input portion 12 of FIG. 1, and also includes a differentiating portion 13 and a not-illustrated sampling portion, which are respectively identical to the differentiating portion 13 and the sampling portion 14 of FIG. 1. IN FIGS. 1 and 7, equivalent parts are identified with the same reference numerals, and the following discussion addresses the differences between these embodiments.

In the input portion 182 of FIG. 7, a reference input defined by terminals 186 and 187 is provided in place of the reference input terminals 16–17 of FIG. 1. The reference input voltage $V_{REF}$ is applied to the terminal 186, and its complement is applied to the terminal 187.

A resistor 191 has a first end coupled to the node 33 between the capacitor 47 and the RTD 31, and has its other end coupled to the terminal 187. An additional RTD 192 has one end coupled to the node 32 between the capacitor 46 and the RTD 31, and has its other end coupled to one end of a resistor 193. The other end of the resistor 193 is coupled to the terminal 186. A reference current source 196 is coupled between the node 32 and ground. The RTDs 31 and 192 are equivalent, and the resistors 191 and 193 are equivalent.

Like the input portions of the other embodiments described above, the input portion 182 takes the reference input signal and converts it into a corresponding current flow through the RTD 31, so that the RTD 31 produces between the nodes 32–33 a voltage of the type shown in the upper graph of FIG. 3. The differentiating portion 13 and the not-illustrated sampling portion of the apparatus 180 operate in the same manner as their counterparts in the apparatus 10 of FIG. 1, and their operation is therefore not discussed here in detail.

FIG. 8 is a schematic diagram of an apparatus 210, which is an alternative embodiment of the apparatus 10 of FIG. 1. The apparatus 210 includes an input portion 212 which is different from the input portion 12 of FIG. 1, and also includes a differentiating portion 13 and a not-illustrated sampling portion which are respectively identical to the differentiating portion 13 and the sampling portion 14 of FIG. 1. In FIGS. 1 and 8, equivalent parts are identified with the same reference numerals, and the following discussion addresses the differences between these embodiments.

In the input portion 212, the input terminals 16–17 and the transformer 26 of FIG. 1 have been replaced with a photodiode 216 and a light source 218. The photodiode 216 is a component of a known type, such as a PIN photodiode or a metal-semiconductor-metal (MSM) photodiode. The photodiode has its anode coupled to the node 32, and its cathode coupled to the node 33. The light source 218 is a periodic pulsed laser of a type known in the art, such as a mode-locked laser, or a fiber-ring laser. Alternatively, the light source 218 could be a continuous laser with a mechanical shutter, or some other device that produces a periodic optical signal. The light source 12 outputs a varying optical signal 221, which serves as a clock signal that varies in a periodic manner. The optical clock signal 221 causes the photodiode 216 to alternate between conducting and non-conducting states. When the photodiode is in its conducting state, it effectively creates an electrical short across the RTD 31, so that the voltage across the RTD 31 is very low or zero. When the photodiode switches to its non-conducting state, current from the bias arrangement will cause a current to develop throught the RTD 31, and the voltage across the RTD 31 will under a quantum jump such as that shown at 87 in FIG. 2. In other respects, the operation of the circuit of FIG. 8 is generally similar to the operation of the circuit 10 of FIG. 1, and is therefore not described here in further detail.

The present invention provides a number of advantages. One such advantage results from the generation of a pulse of very narrow width through use of a resonant tuning diode with a high slew rate, where the slew rate is on the order of about 3 picoseconds per volt. This is five to ten times faster than the slew rate of the step recovery diodes (SRDs) used in pre-existing systems. Therefore, when the voltage across the RTD is differentiated, the result is a pulse with a very narrow width, which can be as much as 1/35 of the width of the typical pulse produced in pre-existing systems using SRDs. The ability to generate a very narrow pulse is advantageous in a variety of applications. As one example, when used in the context of a very fast sampling phase detector for a low-noise phase-locked microwave oscillator, the narrow pulse provides more accurate sampling, along with a reduction in jitter and an increase in bandwidth, where the bandwidth can be as much as five to ten times better than in comparable pre-existing systems which utilize SRDs. By using an RTD to generate a narrow pulse, sampling can occur at frequencies of 100 GHz to 200 Ghz, which was not possible with the wider pulses generated in pre-existing systems using SRDs.

Although several selected embodiments have been illustrated and described in detail, it will be understood that various substitutions and alterations can be made without departing from the scope of the present invention. That is, the depicted circuits are merely exemplary, and it is possible to add, delete, and/or rearrange components, or to utilize different circuit configurations, while still realizing the present invention. Other substitutions and alterations are also possible without departing from the spirit and scope of the present invention, as defined by the following claims.

What is claimed is:

1. An apparatus comprising a circuit which includes:

a first portion having a resonant tunneling device arranged so that, in response to an input signal, said resonant tunneling device causes an electrical signal characteristic to undergo a quantum jump in magnitude from a first value to a second value, said second value being substantially different from said first value, and said quantum jump in magnitude from said first value to said second value taking an interval of time; and a second portion having a differentiator which responds to said quantum jump of said electrical signal characteristic from said first value to said second value by producing a narrow pulse having a duration which is approximately equal to said interval of time.

2. An apparatus according to claim 1, wherein said resonant tunneling device is a resonant tunneling diode, and said electrical signal characteristic is a voltage across said resonant tunneling diode.

3. An apparatus according to claim 2, wherein said differentiator includes first and second capacitors which each have first and second ends, said first end of each said capacitor being coupled to a respective end of said resonant tunneling diode.

4. An apparatus according to claim 2, wherein said first portion includes:

first and second resistors which each have a first end coupled to a respective end of said resonant tunneling diode, and a second end coupled to ground; and first and second capacitors which each have a first end coupled to a respective end of said resonant tunneling diode, and a second end coupled to ground.

5. An apparatus according to claim 2, wherein said first portion includes a transformer having an input coil responsive to said input signal, and having an output coil with first and second ends which are each coupled to a respective end of said resonant tunneling diode.

6. An apparatus according to claim 2, wherein said resonant tunneling diode has first and second ends, said first end of said resonant tunneling diode being coupled to a first bias voltage; and wherein said first portion includes:

a resistor having first and second ends, said second end of said resistor being coupled to a second bias voltage less than said first bias voltage; and a transistor having two terminals respectively coupled to said second end of said resonant tunneling diode and said first end of said resistor, and having a control terminal coupled to said input signal.

7. An apparatus according to claim 2, wherein said resonant tunneling diode has first and second ends, said second end of said resonant tunneling diode being coupled to ground; and wherein said first portion includes:

a resistor having first and second ends, said second end of said resistor being coupled to said first end of said resonant tunneling diode;

a transistor having a first terminal coupled to a first bias voltage, a second terminal coupled to said first end of said resistor, and a control terminal coupled to said input signal; and a constant current source having a first end coupled to said second terminal of said transistor, and a second end coupled to a second bias voltage which is less than said first bias voltage.

8. An apparatus according to claim 7, wherein said constant current source includes a field effect transistor having one of the source and drain thereof coupled to said first end of said resistor and the other of the source and drain thereof coupled to said second bias voltage, and having the gate thereof coupled to said other of said source and drain thereof.

9. An apparatus according to claim 2, wherein said resonant tunneling diode is a first resonant tunneling diode and has first and second ends; and wherein said first portion includes:

a second resonant tunneling diode having first and second ends, said first end of said first resonant tunneling diode being coupled to said second end of said second resonant tunneling diode;

a reference current source coupled to said first end of said first resonant tunneling diode;

a first resistor having a first end coupled to said first end of said second resonant tunneling diode, and a second end coupled to said input signal; and a second resistor having a first end coupled to said second end of said first resonant tunneling diode and a second end coupled to an inverse of said input signal.

10. An apparatus comprising a circuit which includes:

a first portion having a resonant tunneling device arranged so that, in response to an input signal, said resonant tunneling device causes an electrical characteristic to undergo a quantum jump in magnitude from a first value to a second value, said second value being substantially different from said first value, and said quantum jump in magnitude from said first value to said second value taking an interval of time; and a second portion having a sampling portion with a sampling input for receiving a signal to be sampled, said sampling portion responding to said quantum jump in magnitude of said electrical signal characteristic from said first value to said second value by causing said sampling portion to sample a signal at said sampling input during a time period which is approximately equal in duration to said interval of time.

11. An apparatus comprising a circuit which includes:

a first portion having a resonant tunneling device arranged so that, in response to an input signal, said resonant tunneling device causes an electrical characteristic to undergo a quantum jump in magnitude from a first value to a second value, said second value being substantially different from said first value, and said quantum jump in magnitude from said first value to said second value taking an interval of time;

a second portion having a sampling portion with a sampling input for receiving a signal to be sampled, said sampling portion responding to said quantum jump in magnitude of said electrical signal characteristic from said first value to said second value by causing said sampling portion to sample a signal at said sampling input during a time period which is approximately equal in duration to said interval of time; and wherein said second portion includes a differentiator which responds to said quantum jump of said electrical signal characteristic from said first value to said second value by producing a narrow pulse having a duration which is approximately equal to said interval of time, said sampling portion effecting said sampling in response to and during said narrow pulse from said differentiator.

12. An apparatus comprising a circuit which includes:

a first portion having a resonant tunneling device arranged so that, in response to an input signal, said resonant tunneling device causes an electrical characteristic to undergo a quantum jump in magnitude from a first value to a second value, said second value being substantially different from said first value, and said quantum jump in magnitude from said first value to said second value taking an interval of time, a second portion having a sampling portion with a sampling input for receiving a signal to be sampled, said sampling portion responding to said quantum jump in magnitude of said electrical signal characteristic from said first value to said second value by causing said sampling portion to sample a signal at said sampling input during a time period which is approximately equal in duration to said interval of time; and wherein said resonant tunneling device is a resonant tunneling diode, and said electrical signal characteristic is a voltage across said resonant tunneling diode.

13. An apparatus according to claim 12, wherein said first portion includes:

first and second resistors which each have a first end coupled to a respective end of said resonant tunneling diode, and a second end coupled to ground; and first and second capacitors which each have a first end coupled to a respective end of said resonant tunneling diode, and a second end coupled to ground.

14. An apparatus according to claim 12, wherein said first portion includes a transformer having an input coil responsive to said input signal, and having an output coil with first and second ends which are each coupled to a respective end of said resonant tunneling diode.

15. An apparatus according to claim 12, wherein said resonant tunneling diode has first and second ends, said first end of said resonant tunneling diode being coupled to a first bias voltage; and wherein said first portion includes:

a resistor having first and second ends, said second end of said resistor being coupled to a second bias voltage less than said first bias voltage; and a transistor having two terminals respectively coupled to said second end of said resonant tunneling diode and said first end of said resistor, and having a control terminal coupled to said input signal.

16. An apparatus according to claim 12, wherein said resonant tunneling diode has first and second ends, said second end of said resonant tunneling diode being coupled to ground; and wherein said first portion includes:

a resistor having first and second ends, said second end of said resistor being coupled to said first end of said resonant tunneling diode;

a transistor having a first terminal coupled to a first bias voltage, a second terminal coupled to said first end of said resistor, and a control terminal coupled to said input signal; and a constant current source having a first end coupled to said second terminal of said transistor, and a second end coupled to a second bias voltage which is less than said first bias voltage.

17. An apparatus according to claim 16, wherein said constant current source includes a field effect transistor having one of the source and drain thereof coupled to said first end of said resistor and the other of the source and drain thereof coupled to said second bias voltage, and having the gate thereof coupled to said other of said source and drain thereof.

18. An apparatus according to claim 12, wherein said resonant tunneling diode is a first resonant tunneling diode and has first and second ends; and wherein said first portion includes:

a second resonant tunneling diode having first and second ends, said first end of said first resonant tunneling diode being coupled to said second end of said second resonant tunneling diode;

a reference current source coupled to said first end of said first resonant tunneling diode;

a first resistor having a first end coupled to said first end of said second resonant tunneling diode, and a second end coupled to said input signal; and a second resistor having a first end coupled to said second end of said first resonant tunneling diode and a second end coupled to an inverse of said input signal.

19. A method comprising:

providing a circuit having a first portion which includes a resonant tunneling device, and a second portion which includes a differentiator;

applying to said first portion an input signal;

causing said resonant tunneling device to respond to said input signal by effecting a quantum jump in magnitude of an electrical signal characteristic from a first value to a second value, said second value being substantially different from said first value, and said quantum jump in magnitude from said first value to said second value taking an interval of time; and causing said differentiator to respond to said quantum jump of said electrical signal characteristic from said first value to said second value by producing a narrow pulse having a duration which is approximately equal to said interval of time.

20. A method according to claim 19, including selecting as said resonant tunneling device a resonant tunneling diode, said electrical signal characteristic being a voltage across said resonant tunneling diode.

21. A method according to claim 20, including configuring said differentiator to have first and second capacitors which each have first and second ends, said first end of each said capacitor being coupled to a respective end of said resonant tunneling diode.

22. A method comprising:

providing a circuit having a first portion which includes a resonant tunneling device, and a second portion which includes a sampling portion with a sampling input;

applying to said first portion an input signal;

applying to said sampling input a signal to be sampled;

causing said resonant tunneling device to respond to said input signal by effecting a quantum jump in magnitude of an electrical signal characteristic from a first value to a second value, said second value being substantially different from said first value, and said quantum jump in magnitude from said first value to said second value taking an interval of time; and causing said sampling portion to respond to said quantum jump in magnitude of said electrical signal characteristic from said first value to said second value by sampling the signal at said sampling input during a time period which is approximately equal in duration to said interval of time.

23. A method according to claim 22, including:

configuring said second portion to include a differentiator;

causing said differentiator to respond to said quantum jump of said electrical signal characteristic from said first value to said second value by producing a narrow pulse having a duration which is approximately equal to said interval of time; and causing said sampling portion to effect said sampling in response to and during said narrow pulse from said differentiator.

24. A method according to claim 22, including selecting as said resonant tunneling device a resonant tunneling diode, said electrical signal characteristic being a voltage across said resonant tunneling diode.

* * * * *